(12) United States Patent
Lee

(10) Patent No.: US 9,966,556 B2
(45) Date of Patent: May 8, 2018

(54) ORGANIC LIGHT-EMITTING DEVICE HAVING A COMPENSATION RESISTANCE PART ELECTRICALLY CONNECTED TO THE AUXILIARY ELECTRODE

(71) Applicant: LG DISPLAY CO., LTD., Seoul (KR)

(72) Inventor: Yeon Keun Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/534,262

(22) PCT Filed: Dec. 8, 2015

(86) PCT No.: PCT/KR2015/013403
§ 371 (c)(1),
(2) Date: Jun. 8, 2017

(87) PCT Pub. No.: WO2016/099067
PCT Pub. Date: Jun. 23, 2016

(65) Prior Publication Data
US 2017/0346035 A1 Nov. 30, 2017

(30) Foreign Application Priority Data
Dec. 15, 2014 (KR) .......................... 10-2014-0180741

(51) Int. Cl.
*H01L 27/32* (2006.01)
*H01L 51/52* (2006.01)
*H01L 51/56* (2006.01)

(52) U.S. Cl.
CPC ........ *H01L 51/5212* (2013.01); *H01L 27/329* (2013.01); *H01L 27/3279* (2013.01); *H01L 51/5206* (2013.01); *H01L 51/5228* (2013.01); *H01L 51/5234* (2013.01); *H01L 51/5268* (2013.01); *H01L 51/56* (2013.01); *H01L 2251/5338* (2013.01)

(58) Field of Classification Search
CPC ... H01L 27/32; H01L 27/3279; H01L 27/329; H01L 51/5212; H01L 51/5228
See application file for complete search history.

(56) References Cited

U.S. PATENT DOCUMENTS

| | | | |
|---|---|---|---|
| 2010/0060147 A1 | 3/2010 | Eom | |
| 2010/0072482 A1 | 3/2010 | Eom et al. | |
| 2013/0168661 A1 | 7/2013 | Min et al. | |
| 2015/0111331 A1* | 4/2015 | Osako | H01L 27/3258 438/34 |
| 2016/0072092 A1 | 3/2016 | Lee et al. | |

FOREIGN PATENT DOCUMENTS

| | | |
|---|---|---|
| EP | 2560462 A1 | 2/2013 |
| JP | 2013-213870 A | 10/2013 |
| KR | 10-2010-0028925 A | 3/2010 |
| KR | 10-2010-0034876 A | 4/2010 |
| KR | 10-2013-0096002 A | 8/2013 |
| KR | 10-2014-0135653 A | 11/2014 |

* cited by examiner

*Primary Examiner* — Hoai V Pham
(74) *Attorney, Agent, or Firm* — Dentons US LLP

(57) ABSTRACT

The present specification relates to an organic light emitting device.

21 Claims, 10 Drawing Sheets

US 9,966,556 B2

ORGANIC LIGHT-EMITTING DEVICE HAVING A COMPENSATION RESISTANCE PART ELECTRICALLY CONNECTED TO THE AUXILIARY ELECTRODE

This application is a National Stage Entry of International Application No. PCT/KR2015/013403, filed on Dec. 8, 2015, and claims the benefit of Korean Patent Application No. 10-2014-0180741, filed on Dec. 15, 2014, all of which are hereby incorporated by reference in their entirety for all purposes as if fully set forth herein.

TECHNICAL FIELD

The present specification relates to an organic light emitting device.

BACKGROUND ART

An organic light emitting phenomenon denotes a phenomenon where electrical energy is converted into light energy by using an organic material. That is, in a case where an organic material layer is disposed between an anode and a cathode, when a voltage is applied between the anode and the cathode, the anode injects a hole into the organic material layer, and the cathode injects an electron into the organic material layer. The hole and the electron which are injected into the organic material layer are combined to generate an exciton, and when the exciton is shifted to a ground state, light is emitted.

A lighting device using an organic light emitting device has a structure where a voltage is applied by a terminal disposed in a border. However, as a current applied to the border flows to a center portion of an emissive area, voltage drop occurs due to an internal resistance.

Due to the voltage drop, luminance non-uniformity occurs between emissive areas. For this reason, an area of the lighting device increases, or a ratio difference occurs between a widthwise side and a lengthwise side of the lighting device occurs. Consequently, if an operating current value increases, the luminance non-uniformity becomes more severe.

Therefore, it is required to develop an organic light emitting device that emits light having uniform luminance by solving luminance non-uniformity between emissive areas.

DISCLOSURE

Technical Problem

The present specification provides an organic light emitting device for solving the problem.

Technical Solution

In one aspect of the present invention, an organic light emitting device includes: a first electrode including two or more pixel parts spaced apart from each other; a second electrode provided opposite to the first electrode; an organic material layer including one or more emission layers provided between the first electrode and the second electrode; and an auxiliary electrode electrically connected to each of the pixel parts, and At least one the pixel part includes a compensation resistance part electrically connected to the auxiliary electrode, and the compensation resistance part has a resistance value which is adjusted so that a voltage applied to a pixel part connected to the compensation resistance part is 0.8 times to 1.2 times a voltage applied to a pixel part where voltage drop occurs as much as possible.

In one aspect of the present invention, a display device including the organic light emitting device is provided.

In one aspect of the present invention, a lighting device including the organic light emitting device is provided.

Advantageous Effect

The organic light emitting device according to an embodiment of the present specification is good in luminance uniformity of an emissive area. In detail, even when the organic light emitting device according to an embodiment of the present specification is implemented to have a large area, good luminance uniformity is maintained.

MODE FOR INVENTION

Figure 1:
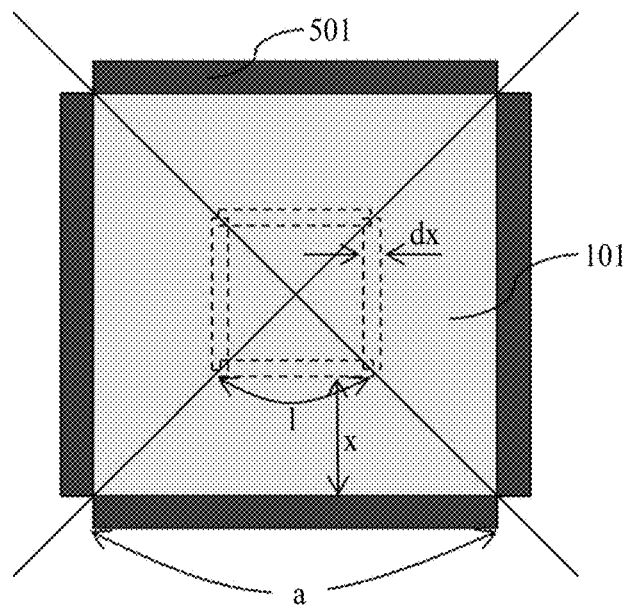
FIG. 1 illustrates an operation of calculating an area where voltage drop occurs as much as possible in an organic light emitting device.

In the present specification, when one member is referred to as being disposed "on" another member, this includes a case where the one member contacts the other member and a case where another member is provided between two members.

In the present specification, when it is described that one includes some elements, it should be understood that it may include only those elements, or it may include other elements as well as those elements if there is no specific limitation.

Hereinafter, the present specification will be described in more detail.

An embodiment of the present specification provides an organic light emitting device includes a first electrode including two or more pixel parts spaced apart from each other; a second electrode provided opposite to the first electrode; an organic material layer including one or more emission layers provided between the first electrode and the second electrode; and an auxiliary electrode electrically connected to each of the pixel parts.

An embodiment of the present specification provides an organic light emitting device in which at least one the pixel part includes a compensation resistance part electrically connected to the auxiliary electrode, and the compensation resistance part has a resistance value which is adjusted so that a voltage applied to a pixel part connected to the compensation resistance part is 0.8 times to 1.2 times a voltage applied to a pixel part where voltage drop occurs as much as possible.

According to an embodiment of the present specification, the compensation resistance part may have a resistance value which is adjusted so that a voltage applied to the pixel part connected to the compensation resistance part is 0.9 times to 1.1 times a voltage applied to the pixel part where voltage drop occurs as much as possible.

"Pixel part" of the present specification may denote a unit of a first electrode where light emitted from an emission layer is transferred to the outside.

Moreover, "pixel part" of the present specification denotes that a dead pixel which does not emit light due to short circuit or the like is excluded. In detail, "pixel part" of the present specification denotes a pixel that normally operates in the organic light emitting device.

In a general organic light emitting device, it is ideal that a terminal part to which power is applied from the outside and all areas of a pixel part have an equivalent potential. However, due to an internal resistance of a material forming an electrode, voltage drop can slightly occur from a position to which power is applied. Therefore, in the pixel part of the organic light emitting device, degrees of voltage drop differ in areas, causing the luminance non-uniformity of the organic light emitting device. In detail, a pixel provided far away from a bezel area to which a voltage is applied from the outside has an internal resistance which is higher than that of a pixel part provided close to the bezel area, and for this reason, shows relatively low luminance because voltage drop occurs. Furthermore, if the organic light emitting device is manufactured to have a large area, as a distance between the bezel area and a pixel part farthest away therefrom becomes longer, the luminance non-uniformity can become more severe.

In order to solve such a problem, the present specification desires to solve the luminance non-uniformity of an organic light emitting device by controlling the amount of current applied to each pixel part with a compensation resistance part.

An organic light emitting device according to an embodiment of the present specification may include a border electrode that electrically connects an external power source to the auxiliary electrode. In detail, the border electrode may be provided on at least one side surface or all side surfaces of an emissive area of the organic light emitting device. In detail, according to an embodiment of the present specification, the border electrode may be provided adjacent to or in contact with a portion of a side surface of the first electrode. According to an embodiment of the present specification, the border electrode may be provided in a portion or a whole portion of an emissive area of a lighting device or a display area of a display device.

According to an embodiment of the present specification, the border electrode may be provided in at least a portion of a bezel area of the organic light emitting device.

According to an embodiment of the present specification, the organic light emitting device may be driven with a voltage applied from the external power source to the border electrode. Furthermore, a current applied to the border electrode may be supplied to each pixel part through the auxiliary electrode, and the compensation resistance part may control the amount of current applied from the auxiliary electrode to the pixel part.

According to an embodiment of the present specification, the border electrode may be provided in an encapsulation area of the organic light emitting device including the emissive area. In this case, the border electrode may include a material which is the same as that of the auxiliary electrode, may be provided to have a width which is wider than that of the auxiliary electrode, and may have a relatively low resistance. In this case, the border electrode may be a vacuum-deposited metal or a printed metal layer.

Moreover, according to an embodiment of the present specification, the border electrode may be provided outside the encapsulation area of the organic light emitting device. In this case, a material of the border electrode may be the same as that of the auxiliary electrode in an encapsulation layer, or a metal film may be attached on the first electrode by a conductive adhesive. Alternatively, an FPCB or the like may be attached on the first electrode by using an ACF or an ACA.

A function of the border electrode enables the external power source to transfer a current to the whole emissive area of the organic light emitting device without voltage drop.

Also, the border electrode may perform a function which enables a stably electrical connection with an external power terminal.

In the organic light emitting device according to an embodiment of the present specification, the compensation resistance part may control an operating voltage of each pixel part to minimize a luminance difference occurring between pixel parts. In detail, the compensation resistance part may control the amount of current applied to each pixel part so as to be equal to a voltage applied to a pixel part where voltage drop occurs as much as possible, thereby enhancing the luminance uniformity of the organic light emitting device. In more detail, the compensation resistance part may assign a low compensation resistance to a pixel part where voltage drop occurs much due to an internal resistance, and may assign a high compensation resistance to a pixel part where voltage drop occurs a little, thereby enabling a uniform voltage to be applied to each pixel part.

According to an embodiment of the present specification, a difference between a maximum value of a resistance from one the pixel part to the auxiliary electrode and a minimum value of a resistance from the other one pixel part to the auxiliary electrode can satisfy the following Equation 1.

$$\frac{1}{64} \times R_{surf} \times N_{cell} \leq R_{diff} \leq \frac{a}{b} \times R_{surf} \times N_{cell} \quad \text{[Equation 1]}$$

In the Equation 1, $R_{diff}$ denotes a difference between a maximum value of a resistance from one the pixel part to the auxiliary electrode and a minimum value of a resistance from the other one pixel part to the auxiliary electrode, $R_{surf}$ denotes a surface resistance of a first electrode, $N_{cell}$ denotes the number of pixel parts, a denotes a length of a longest side of the organic light emitting device, and b denotes a length of a shortest side of the organic light emitting device.

According to an embodiment of the present specification, a in the Equation 1 may denote a length of a longest side of an emission surface of the organic light emitting device. According to an embodiment of the present specification, b in the Equation 1 may denote a length of a shortest side of the emission surface of the organic light emitting device. In detail, if the organic light emitting device includes the emission surface having a rectangular shape, a length of a long side of the rectangular shape may denote a in the Equation 1, and a length of a short side of the rectangular shape may denote b in the Equation 1.

According to an embodiment of the present specification, if the Equation 1 is satisfied, luminance of each pixel part can be uniform.

The maximum value of the resistance from the pixel part to the auxiliary electrode may denote a resistance of a compensation resistance part connected to a pixel part where voltage drop occurs as little as possible.

The minimum value of the resistance from the pixel part to the auxiliary electrode may denote a resistance in a pixel part, where voltage drop occurs as much as possible, from the auxiliary electrode. In detail, the minimum value of the resistance from the pixel part to the auxiliary electrode may be the same as an internal resistance value of the auxiliary electrode when the compensation resistance part is not included in the pixel part where voltage drop occurs as much as possible. Also, the minimum value of the resistance from the pixel part to the auxiliary electrode may denote a resistance of a compensation resistance part connected to the pixel part where voltage drop occurs as much as possible.

According to an embodiment of the present specification, the first electrode may be a transparent electrode, the auxiliary electrode may be a metal electrode, and a surface resistance of the first electrode may be changed by a surface resistance of the auxiliary electrode and a surface resistance of the transparent electrode. In detail, if the auxiliary electrode is a metal electrode, the auxiliary electrode is sufficiently lower in surface resistance than the first electrode which is the transparent electrode. In this case, a surface resistance value of the first electrode which is the transparent electrode hardly affects a surface resistance value of the first electrode and is determined by a surface resistance value of the auxiliary electrode. That is, the surface resistance value of the first electrode which is the transparent electrode is ignorable, and thus, the surface resistance of the first electrode may be considered as the surface resistance value of the auxiliary electrode itself. However, if an auxiliary electrode for the first electrode is not a metal electrode but is a material which is high in resistance, the surface resistance of the first electrode may be calculated in consideration of both a surface resistance of the auxiliary electrode and the surface resistance of the first electrode which is the transparent electrode.

In detail, according to an embodiment of the present specification, a difference between a maximum value of a resistance from one the pixel part to the auxiliary electrode and a minimum value of a resistance from the other one pixel part to the auxiliary electrode can satisfy the following Equation 1-1.

$$\frac{1}{16} \times R_{surf} \times N_{cell} \leq R_{diff} \leq \frac{1}{2} \times \frac{a}{b} \times R_{surf} \times N_{cell} \quad \text{[Equation 1-1]}$$

In the Equation 1-1, $R_{diff}$, $R_{surf}$, $N_{cell}$, a, and b are as defined in the Equation 1.

According to an embodiment of the present specification, a in the Equation 1 and the Equation 1-1 may be a length which becomes farther away from a side surface supplied with an external current, or may be a length of a side surface which is not supplied with the external current. Also, according to an embodiment of the present specification, b in the Equation 1 and the Equation 1-1 may be a length of a side surface supplied with the external current.

Moreover, according to an embodiment of the present specification, when the organic light emitting device is supplied with a current from all side surfaces, a/b of the Equation 1 and the Equation 1-1 may be 1.

According to an embodiment of the present specification, a resistance of the compensation resistance part can satisfy the following Equation 2.

$$0.5 \times \left( \frac{V_{IRdrop_{max}}}{A_{cell_{max}}} - \frac{V_{IRdrop_{cell}}}{A_{cell}} \right) + z \leq \quad \text{[Equation 2]}$$

$$R_{comp_{cell}} \leq 2 \times \left( \frac{V_{IRdrop_{max}}}{A_{cell_{max}}} - \frac{V_{IRdrop_{cell}}}{A_{cell}} \right) + z$$

In the Equation 2, $R_{comp\_cell}$ denotes the resistance of the compensation resistance part, $V_{IRdrop\_max}$ denotes a voltage in a pixel part where voltage drop occurs as much as possible, $A_{cell\_max}$ denotes a current in the pixel part where voltage drop occurs as much as possible, $V_{IRdrop\_cell}$ denotes a voltage in a pixel part including the compensation resistance part, $A_{cell}$ denotes a current in the pixel part including the compensation resistance part, and Z is 0Ω to 300,000Ω.

According to an embodiment of the present specification, a z value of the Equation 2 may be a resistance value for selectively assigning a short circuit prevention function to the compensation resistance part. According to an embodiment of the present specification, when an anode and a cathode of an arbitrary pixel part of the organic light emitting device contact each other to cause short circuit, the compensation resistance part can prevent an overall operation of the organic light emitting device from being stopped because all applied currents flow to a short circuit occurrence area. That is, even when short circuit occurs in one pixel part, the compensation resistance part blocks a leakage current with an appropriate resistance value, thereby enabling the organic light emitting device to overall operate in a normal range. According to an embodiment of the present specification, a resistance value which is additionally needed for preventing the short circuit is the same as z.

According to an embodiment of the present specification, a resistance of the compensation resistance part can satisfy the following Equation 2-1.

$$0.25 \times \left( \frac{V_{IRdrop_{max}}}{A_{cell_{max}}} - \frac{V_{IRdrop_{cell}}}{A_{cell}} \right) + z \leq$$

$$R_{comp_{cell}} \leq 1.5 \times \left( \frac{V_{IRdrop_{max}}}{A_{cell_{max}}} - \frac{V_{IRdrop_{cell}}}{A_{cell}} \right) + z$$

[Equation 2-1]

In the Equation 2-1, $R_{comp\_cell}$, $V_{IRdrop\_max}$, $A_{cell\_max}$, $V_{IRdrop\_cell}$, $A_{cell}$, and z are as defined in the Equation 2.

According to an embodiment of the present specification, if the compensation resistance part has a resistance value satisfying the Equation 2 or the Equation 2-1, a difference between the amounts of currents applied to the respective pixel parts is not large, and thus, luminance uniformity can be enhanced.

Figure 5:
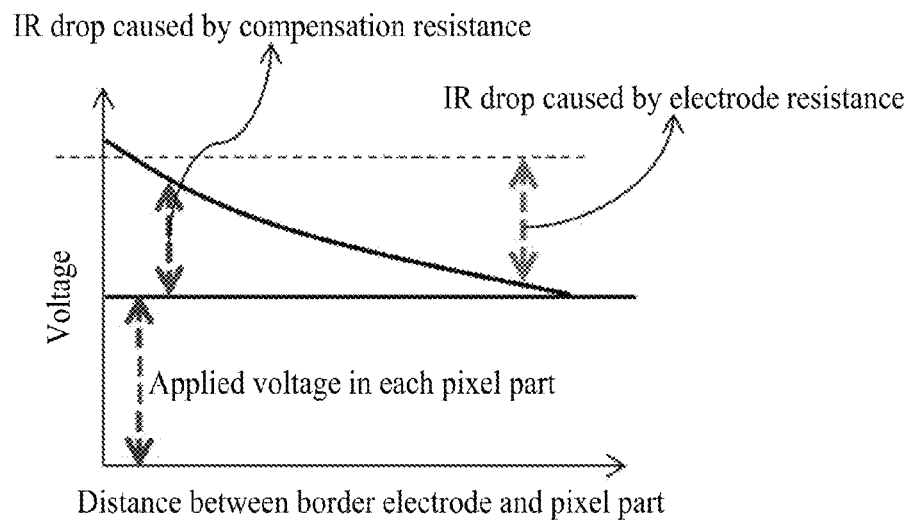
FIG. 5 shows a voltage applied to an organic light emitting device according to an embodiment of the present specification.

FIG. 5 shows a voltage applied to an organic light emitting device according to an embodiment of the present specification. In detail, FIG. 5 shows the voltage drop (IR drop) of a pixel part based on a distance to a border electrode and voltage drop (IR drop) based on a compensation resistance part. As shown in FIG. 5, in the organic light emitting device according to an embodiment of the present specification, a uniform voltage may be applied to each pixel part due to the compensation resistance part, thereby solving luminance non-uniformity.

The inventors have performed the following experiment for checking a voltage drop value at a position where lowest luminance is shown in a whole emissive area of the organic light emitting device.

The inventors have performed the experiment on the organic light emitting device on the assumption that a surface resistance of a cathode is 0 and is sufficiently low, voltage drop (IR drop) in border electrodes provided in four edges of a first electrode having a square shape is 0, and a current-voltage (I-V) characteristic of an organic material layer has a certain current value irrespective of voltage shift.

FIG. 1 illustrates an operation of calculating an area where voltage drop occurs as much as possible in an organic light emitting device. In detail, FIG. 1 illustrates an organic light emitting device where a border electrode 501 is provided in each of four edges of a first electrode 101 having a tetragonal shape.

In a case where a voltage is applied to the border electrode, if a current applied to the whole first electrode is $A_{org}$ and a surface resistance of the first electrode is $R_{surf}$, a current input to the border electrode of each edge is supplied to an organic material layer through the first electrode in each triangular area as in FIG. 1.

In FIG. 1, voltage drop has been calculated in an x point of a device including a square electrode where a length of one side is a. In a calculation method, a current value flowing in the x point is calculated, a resistance value of when the current value flows in the x point is calculated, and the calculated current value and the calculated resistance value are multiplied. It has been assumed that a current flowing from the border electrode to a center portion of the first electrode has passed through the organic material layer by a ratio of a moving area to a whole area of the first electrode. When it is assumed that a length of a side of a tetragonal shape which is spaced apart from the border electrode by x in a center direction of the tetragonal shape is 1, the current flowing in the x point is the same as an area ratio of an area of a tetragonal shape including a side having a length "a" to an area of a tetragonal shape including a side having a length "l".

Therefore, in FIG. 1, the amount "$A_x$" of current flowing in the x point is as follows.

$$A_x = A_{org} \frac{l^2}{a^2}$$

In FIG. 1, a resistance "$R_{dx}$" of a dx section is as follows.

$$R_{dx} = \frac{R_{surf}}{4l} dx$$

In FIG. 1, by using the amount "$A_x$" of current flowing in the x point and the resistance "$R_{dx}$" of the dx section, voltage drop "$V_{IRdrop}$" from the border electrode to the x point is as follows.

In FIG. 1, a triangle where a length of a bottom side is a and a height is a/2 and a triangle where a length of a bottom side is l and a height is a/(2−x) have the same shape, and thus, have a relationship "a:a/2=l:a/(2−x)", whereby the following equation may be calculated.

$$V_{IRdrop} = \int_0^x \left( A_{org} \times \frac{l^2}{a^2} \times \frac{R_{surf}}{4l} \right) dx$$

$$= \frac{A_{org} \times R_{surf}}{2a^2} \times \left[ \frac{a}{2}x - \frac{1}{2}x^2 \right]_0^x$$

As in FIG. 1, if the border electrode is provided in each of the four edges of the first electrode, a point farthest away from the border electrode is a point "x=a/2". Therefore, as in FIG. 1, a maximum voltage drop value occurs in the point "x=a/2" and is as follows.

$$V_{IRdrop\_max} = \frac{1}{16} \times R_{surf} \times A_{org}$$

Figure 2:
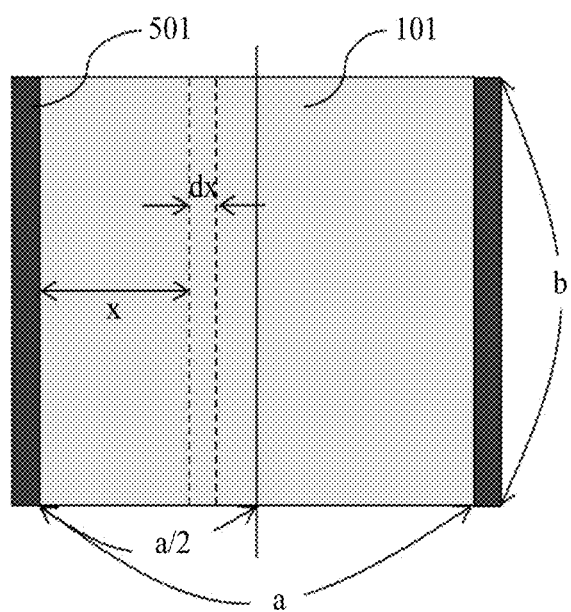
FIG. 2 illustrates an operation of calculating an area where voltage drop occurs as much as possible in an organic light emitting device.

FIG. 2 illustrates an operation of calculating an area where voltage drop occurs as much as possible in an organic light emitting device. In detail, FIG. 2 illustrates an organic light emitting device where a border electrode 501 is provided in each of two edges of a first electrode 101 facing each other.

In FIG. 2, a current "$A_{org}$" input to the border electrode of each edge is supplied from each border electrode to two portions into which the first electrode is divided.

In FIG. 2, the amount "$A_x$" of current flowing in an x point is as follows.

$$A_x = \frac{A_{org}}{2} - \frac{A_{org}}{2} \frac{x}{a/2} = \frac{A_{org}}{2} - A_{org}\frac{x}{a}$$

In FIG. 2, a resistance "$R_{dx}$" of a dx section is as follows.

$$R_{dx} = \frac{R_{surf}}{b} dx$$

In FIG. 2, by using the amount "$A_x$" of current flowing in the x point and the resistance "$R_{dx}$" of the dx section, voltage drop "$V_{IRdrop}$" from the border electrode to the x point is as follows.

$$V_{IRdrop} = \int_0^x \left\{ \left( \frac{A_{org}}{2} - A_{org}\frac{x}{a} \right) \times \frac{R_{surf}}{b} \right\} dx$$
$$= \frac{A_{org} \times R_{surf}}{b} \times \left[ \frac{x}{2} - \frac{x^2}{2a} \right]_0^x$$

As in FIG. 2, if the border electrode is provided in each of the two edges of the first electrode facing each other, a point farthest away from the border electrode is a point "x=a/2". Furthermore, if the first electrode of FIG. 2 is a square, a value of a is the same as a value of b. Therefore, as in FIG. 2, a maximum voltage drop value occurs in the point "x=a/2" and is as follows.

$$V_{IRdrop\_max} = \frac{1}{8} \times R_{surf} \times A_{org}$$

Figure 3:
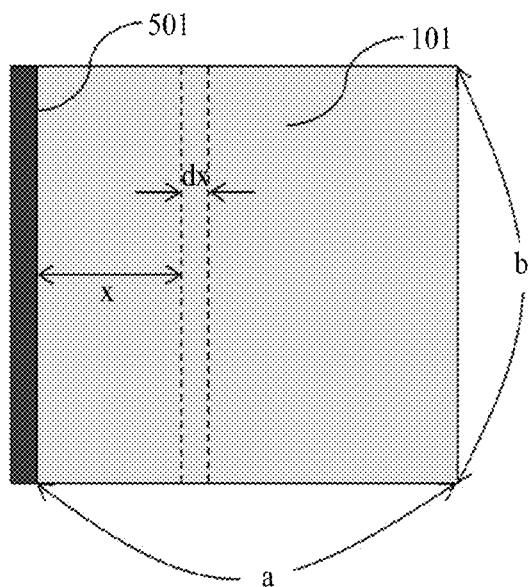
FIG. 3 illustrates an operation of calculating an area where voltage drop occurs as much as possible in an organic light emitting device.

FIG. 3 illustrates an operation of calculating an area where voltage drop occurs as much as possible in an organic light emitting device. In detail, FIG. 3 illustrates an organic light emitting device where a border electrode 501 is provided in only one edge of a first electrode 101.

In FIG. 3, a current "$A_{org}$" input to the border electrode is supplied to the whole first electrode.

In FIG. 3, the amount "$A_x$" of current flowing in an x point is as follows.

$$A_x = A_{org} - A_{org}\frac{x}{a}$$

In FIG. 3, a resistance "$R_{dx}$" of a dx section is as follows.

$$R_{dx} = \frac{R_{surf}}{b} dx$$

In FIG. 3, by using the amount "$A_x$" of current flowing in the x point and the resistance "$R_{dx}$" of the dx section, voltage drop "$V_{IRdrop}$" from the border electrode to the x point is as follows.

$$V_{IRdrop} = \int_0^x \left\{ \left( \frac{A_{org}}{2} - A_{org}\frac{x}{a} \right) \times \frac{R_{surf}}{b} \right\} dx$$
$$= \frac{A_{org} \times R_{surf}}{b} \times \left[ x - \frac{x^2}{2a} \right]_0^x$$

As in FIG. 3, if the border electrode is provided in each of the two edges of the first electrode facing each other, a point farthest away from the border electrode is a point "x=a". Furthermore, if the first electrode of FIG. 3 is a square, a value of a is the same as a value of b. Therefore, as in FIG. 3, a maximum voltage drop value occurs in the point "x=a" and is as follows.

$$V_{IRdrop\_max} = \frac{1}{2} \times R_{surf} \times A_{org}$$

As reviewed through FIGS. 1 to 3, it can be confirmed that a maximum voltage drop value of when the organic light emitting device has a square shape has a difference up to eight times depending on a shape of the border electrode.

In FIG. 3, if the organic light emitting device is not square, a maximum voltage drop value in a point "x=3" is as follows.

$$V_{IRdrop\_max} = \frac{1}{2} \times \frac{a}{b} \times R_{surf} \times A_{org}$$

As seen in the equation, in a case where the organic light emitting device has a rectangular shape instead of a square, it can be seen that if a ratio of a length of a widthwise side to a length of a lengthwise side is outside 1, a maximum voltage drop value increases in proportion thereto.

Figure 4:
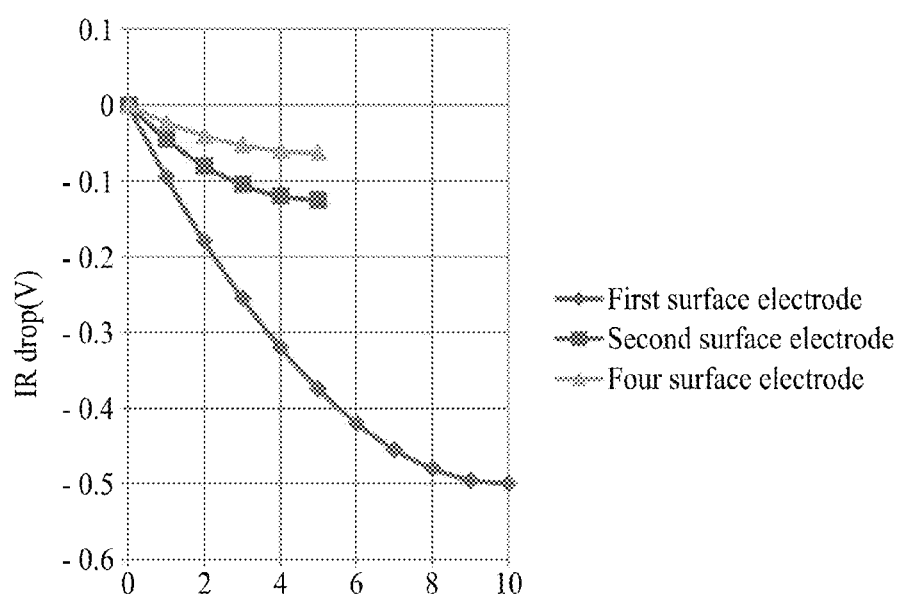
FIG. 4 shows a degree of voltage drop (IR drop) with respect to an organic light emitting device based on FIGS. 1 to 3.

FIG. 4 shows a degree of voltage drop (IR drop) with respect to an organic light emitting device based on FIGS. 1 to 3. In detail, FIG. 4 shows a degree of voltage drop with respect to positions when a current "$A_{org}$" applied to the first electrode is 0.1 A and a surface resistance "$R_{surf}$" of the first electrode is 10Ω/□. In FIG. 3, the x axis denotes a distance from the border electrode, x=0 denotes an area contacting the border electrode, and x=5 denotes a center portion of the first electrode.

FIGS. 1 to 3 have been designed for calculating a maximum value of voltage drop in the organic light emitting device, and the organic light emitting device of the present specification may be manufactured in various shapes such as a circular shape, a hexagonal shape, etc., in addition to the shapes illustrated in FIGS. 1 to 3.

Moreover, in FIGS. 1 to 3, pixel parts spaced apart from a certain pixel part are not illustrated for convenience of calculation, but even when the first electrode includes two or more pixel parts, the same result may be obtained.

$A_{org}$ denotes a current applied to the whole first electrode and is the same as a total sum of currents applied to the respective pixel parts, and thus, $A_{org}=N_{cell} \times A_{cell}$ is satisfied.

$N_{cell}$ denotes the number of pixel parts, and $A_{cell}$ denotes a current applied to a pixel part.

In the organic light emitting device according to an embodiment of the present specification, an internal resistance value "$R_{cell\_max}$" of a pixel part where voltage drop occurs maximally has been calculated, based on the calculated maximum voltage drop value.

The internal resistance value "$R_{cell\_max}$" of the pixel part where voltage drop occurs maximally in the organic light emitting device may denote a resistance from a pixel part, provided at a position farthest away from the border electrode, to the auxiliary electrode and is the same as a value of $V_{IRdrop\_max}/A_{cell\_max}$.

In detail, according to an embodiment of the present specification, the internal resistance value "$R_{cell\_max}$" of the pixel part where voltage drop occurs maximally in the organic light emitting device can satisfy the following Equation 3.

$$\frac{1}{16} \times R_{surg} \times N_{cell} \leq R_{cell\_max} \leq \frac{1}{2} \times R_{surf} \times N_{cell} \qquad \text{[Equation 3]}$$

In the Equation 3, $R_{cell\_max}$ denotes an internal resistance value of a pixel part where voltage drop occurs maximally, $R_{surf}$ denotes the surface resistance of the first electrode, and $N_{cell}$ denotes the number of pixel parts.

Figure 6:
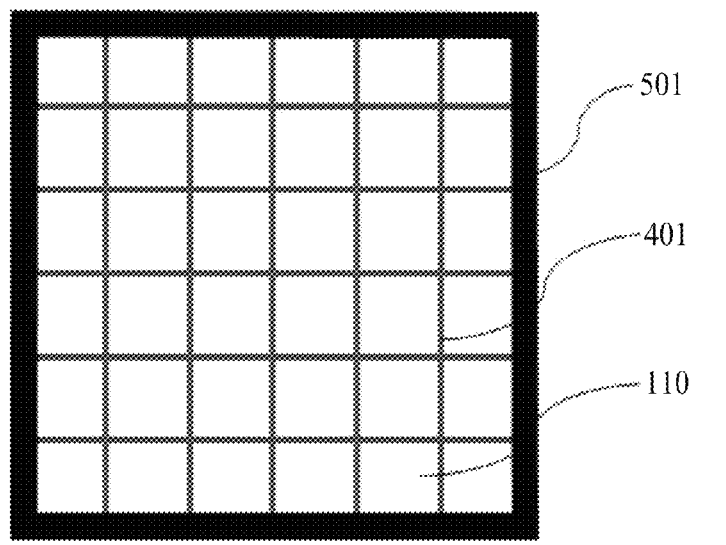
FIG. 6 illustrates a plan view of an organic light emitting device according to an embodiment of the present specification.

FIG. 6 illustrates a plan view of an organic light emitting device according to an embodiment of the present specification. In detail, FIG. 6 illustrates an organic light emitting device which includes a border electrode 501, a lattice type auxiliary electrode 401, and a pixel part 110. In the organic light emitting device, a voltage is applied from an external power source to the border electrode 501, and a current is supplied to each pixel part 110 through the auxiliary electrode 401.

Figure 7:
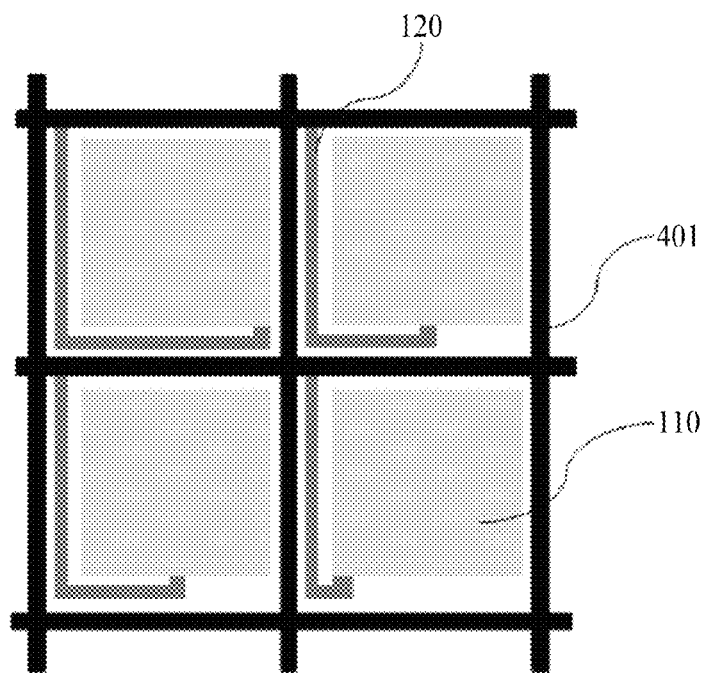
FIG. 7 illustrates a portion of a first electrode of an organic light emitting device according to an embodiment of the present specification.

FIG. 7 illustrates a portion of a first electrode of an organic light emitting device according to an embodiment of the present specification. In detail, in FIG. 7, a plurality of pixel part 110 are respectively provided in a plurality of areas divided by a plurality of lattice type auxiliary electrodes 401, and each of the pixel parts 110 is electrically connected to the auxiliary electrode 401 through a compensation resistance part 120. Also, in FIG. 7, lengths of the compensation resistance parts 120 connected to the respective pixel parts are differently set, and a voltage applied to each pixel part 110 may be uniformly controlled.

Figure 8:
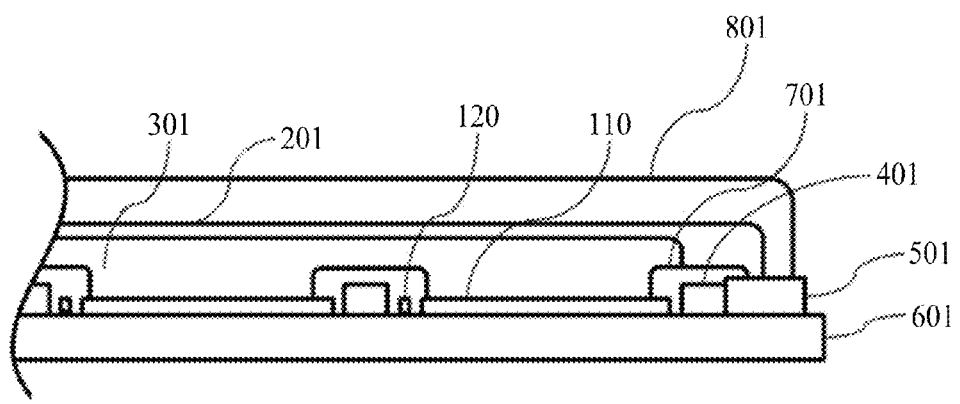
FIG. 8 illustrates an example of a cross-sectional view of an organic light emitting device according to an embodiment of the present specification.

FIG. 8 illustrates an example of a cross-sectional view of an organic light emitting device according to an embodiment of the present specification. In detail, FIG. 8 illustrates a cross-sectional view of an organic light emitting device including a pixel part 110 and a compensation resistance part 120 as in FIG. 7. FIG. 8 illustrates a structure where two or more pixel parts 110 are provided on a substrate 601, a compensation resistance part 120 is provided between the pixel part 110 and the auxiliary electrode 401, a border electrode 501 is provided in an edge of the organic light emitting device, an insulation layer 701 for insulating the auxiliary electrode 401 and the compensation resistance part 120 from an organic material layer 301 is provided, and the organic material layer 301, a second electrode 201, and an encapsulation layer 801 are sequentially stacked.

The organic light emitting device according to an embodiment of the present specification is not limited to the structures of FIGS. 6 to 8 and may be manufactured as various types.

According to an embodiment of the present specification, the compensation resistance part may be formed of a material which is the same as or different from that of the pixel part. According to an embodiment of the present specification, if the compensation resistance part is formed of a material which is the same as that of the pixel part, the compensation resistance part may be a resistance area which is connected to the pixel part and is formed in a step of patterning the first electrode. Also, according to an embodiment of the present specification, if the compensation resistance part is formed of a material which differs from that of the pixel part, a desired resistance value may be obtained by using a material having a resistance which is higher than that of the pixel part.

According to an embodiment of the present specification, the compensation resistance part may include an area where a length in a direction in which a current flows is longer than a width in a direction vertical thereto. In detail, the compensation resistance part may adjust the length and width to obtain a compensation resistance value necessary for each pixel part.

According to an embodiment of the present specification, each pixel part may include the compensation resistance part. In detail, according to an embodiment of the present specification, all of the pixel parts may each include the compensation resistance part. In this case, a voltage additionally applied to a pixel part where voltage drop occurs maximally may be further lowered by the compensation resistance part.

According to an embodiment of the present specification, the auxiliary electrode may be electrically connected to each pixel part through the compensation resistance part. In detail, according to an embodiment of the present specification, each pixel part may be supplied with a current from the auxiliary electrode through the compensation resistance part or may supply a current to the auxiliary electrode through the compensation resistance part.

According to an embodiment of the present specification, a resistance of a compensation resistance part connected to a pixel part where the voltage drop occurs maximally may perform a short circuit prevention function of the organic light emitting device. Furthermore, according to an embodiment of the present specification, a resistance value of the compensation resistance part connected to the pixel part where the voltage drop occurs maximally may be additionally and identically set in the other pixel parts.

According to an embodiment of the present specification, a resistance value of a compensation resistance part connected to a pixel part where the voltage drop occurs maximally may denote a z value in the Equation 2 or Equation 2-1.

According to an embodiment of the present specification, a difference between an operating voltage of one the pixel part and an operating voltage of the other one pixel part may be equal to or less than 0.01 V. In detail, according to an embodiment of the present specification, a difference between voltages applied to the respective pixel parts may be minimized by the compensation resistance part, thereby emitting light having uniform brightness.

According to an embodiment of the present specification, a luminance difference in a whole emissive area of the organic light emitting device may be equal to or less than 10%. In detail, if the luminance difference in the whole emissive area is more than 10%, the luminance difference can be recognized with eyes, and thus, it is important to manage the luminance difference to within 10%.

In detail, according to an embodiment of the present specification, the luminance difference may have the same meaning as that of a luminance reduction rate, and the luminance reduction rate may be calculated as follows.

luminance reduction rate (%)=1−(luminance of darkest pixel part/luminance of brightest pixel part)

Moreover, in a case where it is possible to perform measurement in an actual device, the equation may be used, and in a case of performing prediction through calculation, the following method may be used.

luminance reduction rate (%)=1−(current in pixel part where voltage drop occurs maximally/current in pixel part where voltage drop occurs minimally)×100

The luminance reduction rate has been calculated based on a current value in an organic material because a luminance of light emitted from an organic material layer is proportional to a current value of the organic material layer.

Figure 9:
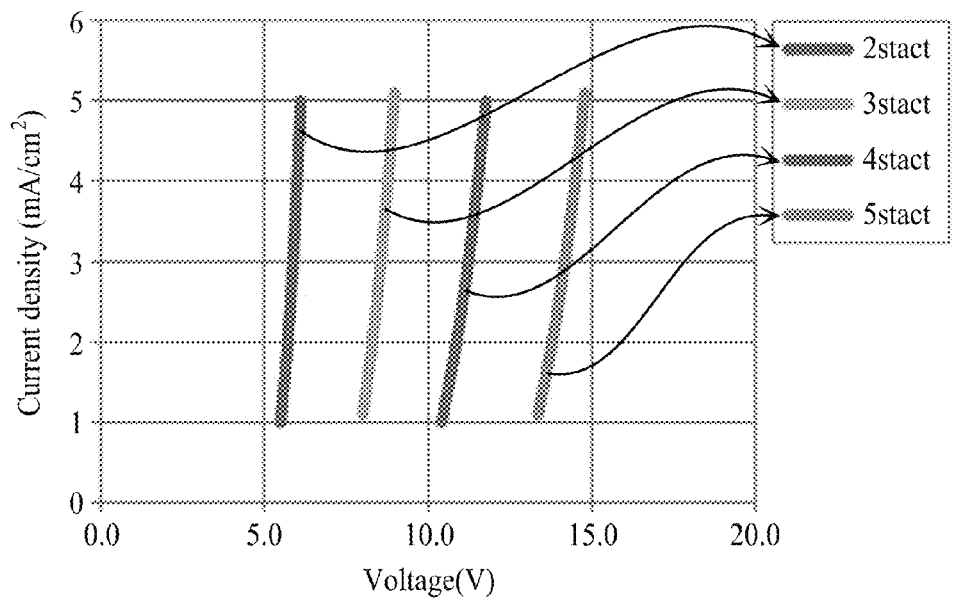
FIG. 9 illustrates a J-V curve of an organic light emitting device including a two to five-layered emission layer.

FIG. 9 illustrates a J-V curve of an organic light emitting device including a two to five-layered emission layer.

Figure 10:
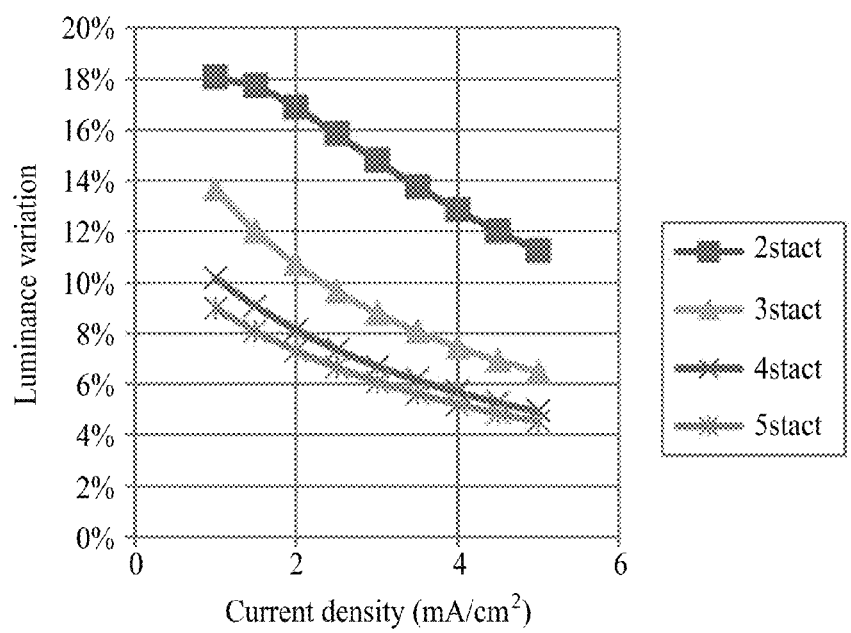
FIG. 10 shows a luminance reduction rate of an organic light emitting device which is caused by voltage drop and is calculated by using a current density value based on the number of emission layers illustrated in FIG. 9.

FIG. 10 shows a luminance reduction rate of an organic light emitting device which is caused by voltage drop of 0.06 V and is calculated by using a current density value based on the number of emission layers illustrated in FIG. 9.

According to an embodiment of the present specification, a difference between a voltage applied to a pixel part where voltage drop occurs maximally and a voltage applied to a pixel part where voltage drop occurs minimally should be managed to 0.06 V or less in order to manage a luminance reduction rate in the whole organic light emitting device to 10% or less in a current density of 1 mA/cm². In detail, as the number of emission layers increases, the luminance reduction rate is lowered under the same condition. In a case where a position-based voltage difference of the pixel parts is 0.06 V, when an emission layer includes four or more layers, the luminance reduction rate may be maintained to 10% or less.

In more detail, according to an embodiment of the present specification, a difference between a voltage applied to a pixel part where voltage drop occurs maximally and a voltage applied to a pixel part where voltage drop occurs minimally should be managed to 0.03 V or less in order to manage a luminance reduction rate caused by the auxiliary electrode in the whole organic light emitting device to 10% or less in a current density of 1 mA/cm². In detail, in a case where the difference between the voltage applied to the pixel part where the voltage drop occurs maximally and the voltage applied to the pixel part where the voltage drop occurs minimally is 0.03 V or less, it is possible to maintain a luminance reduction rate of a device, where an emission layer includes three or less layers, to 10% or less.

According to an embodiment of the present specification, the pixel parts may be electrically connected to each other in parallel.

According to an embodiment of the present specification, the first electrode may be a transparent electrode.

If the first electrode is the transparent electrode, the first electrode may be conductive oxide such as indium tin oxide (ITO) or oxide zinc indium (IZO). Furthermore, the first electrode may be a semitransparent electrode. If the first electrode is the semitransparent electrode, the first electrode may be manufactured with semitransparent metal such as Ag, Au, Mg, Ca, or an alloy thereof. If the semitransparent metal is used as the first electrode, the organic light emitting device may have a micro-cavity structure.

According to an embodiment of the present specification, the surface resistance of the pixel part may be 1Ω/□ or more, or may be 3Ω/□ or more. In detail, the surface resistance of the pixel part may be 10Ω/□ or more. Also, the surface resistance of the pixel part may be 10,000Ω/□ or less, or may be 1,000Ω/□ or less. That is, the surface resistance of the pixel part of the present specification may be 1Ω/□ or more and 10,000Ω/□ or less, or may be 10Ω/□ or more and 1,000Ω/□ or less.

According to an embodiment of the present specification, the pixel part and the compensation resistance part may be formed by patterning the first electrode, and the surface resistance of the pixel part may be the same as the surface resistance of the first electrode or the compensation resistance part.

According to an embodiment of the present specification, the auxiliary electrode may be formed of a conductive line electrically connected to each other. In detail, the conductive line may be formed of a conductive unit. In detail, the whole auxiliary electrode may be driven by applying a voltage to at least a portion of the auxiliary electrode of the present specification.

According to an embodiment of the present specification, the auxiliary electrode may be a metal electrode.

The auxiliary electrode may generally use all metals. In detail, the auxiliary electrode may include aluminum, copper, and/or silver which are/is good in conductivity. When the auxiliary electrode uses aluminum for an adhesive force to a transparent electrode and stability in a photo process, the auxiliary electrode may use a molybdenum/aluminum/molybdenum layer.

According to an embodiment of the present specification, the surface resistance of the auxiliary electrode may be 3Ω/□ or less. In detail, the surface resistance of the auxiliary electrode may be 1Ω/□ or less.

According to an embodiment of the present specification, the border electrode may be a metal electrode. In detail, the border electrode may be formed of a material which is the same as that of the auxiliary electrode.

The auxiliary electrode may be formed to have a fine line width which is difficult to observe with eyes, for increasing an aperture ratio of the organic light emitting device, but since the border electrode is provided in a border area which does not correspond to the emissive area of the organic light emitting device, the border electrode may be formed to have a line width which is thicker than that of the auxiliary electrode. However, in consideration of a trend of manufacturing an electrode device with a minimized border, there is a limitation in considerably increasing a thickness of the line width of the border electrode.

According to an embodiment of the present specification, the organic material layer may include a one or more-layered emission layer and may further include one kind or two or more kinds of layers selected from the group consisting of a hole injecting layer; a hole transporting layer; a hole blocking layer; a charge generating layer; an electron blocking layer; an electron transporting layer; and an electron injecting layer.

The charge generating layer denotes a layer which generates a hole and an electron when a voltage is applied thereto.

According to an embodiment of the present specification, the organic light emitting device may further include a substrate, and the first electrode may be provided on the substrate.

The substrate may use a substrate which is good in transparency, surface smoothness, manageability, and waterproofness. In detail, the substrate may use a glass substrate, a thin film glass substrate, or a transparent plastic substrate. The plastic substrate may include a film, such as polyethylene terephthalate (PET), polyethylene naphthalate (PEN), polyether ether ketone (PEEK), and polyimide (PI), in a single-layer type or a multi-layer type. Also, the substrate itself may include a light scattering function. However, the substrate is not limited thereto and may use a substrate which is commonly used in the organic light emitting device.

According to an embodiment of the present specification, the first electrode may be an anode, and the second electrode may be a cathode. Also, the first electrode may be a cathode, and the second electrode may be an anode.

The anode may use a material having a large work function in order for a hole to be smoothly injected into the organic material layer. Detailed examples of an anode material available to the present invention may include metal, such as vanadium, chrome, copper, zinc, and gold, or an alloy thereof; metal oxide such as zinc oxide, indium oxide, indium tin oxide (ITO), and indium zinc oxide (IZO); a combination of oxide and metal such as ZnO:Al or SnO$_2$:Sb; and a conductive polymer such as poly(3-methyltiolen), poly[3,4-(ethylene-1,2-deoxy)thiophene] (PEDT), polypyrole, and polyaniline, but are not limited thereto.

The anode material is not limited to only the anode and may be used as material of the cathode.

The cathode may use a material having a small work function in order for an electron to be easily injected into the organic material layer. Detailed examples of a cathode material may include metal, such as magnesium, calcium, sodium, kalium, titanium, indium, yttrium, lithium, gadolinium, aluminum, silver, tin, and lead, or an alloy thereof; and a multi-layer structure material such as LiF/Al or LiO$_2$/Al, but are not limited thereto.

A material of the cathode is not limited to the cathode and may be used as a material of the anode.

A material, which is capable of moving a hole, transported from the anode or the hole injecting layer, to an emission layer and is large in mobility for holes, is suitable for a material of the hole transporting layer according to the present specification. Detailed examples of the material of the hole transporting layer may include an arylamine-based organic material, a conductive polymer, and a block copolymer including a conjugation part and a non-conjugation part, but are not limited thereto.

A material of the emission layer according to the present specification may use a material which emits light having a visible light range by combining a hole and an electron respectively transported from the hole transporting layer and the electron transporting layer and is good in quantum efficiency for fluorescence or phosphorescence. Detailed examples of the material of the emission layer may include 8-hydroxy-quinoline aluminum complex (Alq3); carbazole-based compound; dimerized styryl compound; BAlq; 10-hydroxybenzo quinolone-metal compound; benzoxazolone, benzthiazolem, and benzimidazole-based compound; poly (p-pphenylenevinylene) (PPV)-based compound; spiro compound; polyfluorene; and rubrene, but are not limited thereto.

A material, which is capable of moving an electron, injected from the cathode, to the emission layer and is large in mobility for electrons, is suitable for a material of the electron transporting layer according to the present specification. Detailed examples of the material of the electron transporting layer may include 8-hydroxyquinoline Al complex (Alq3); complex including Alq3; organic radical compound; and hydroxyflavone-metal complex, but are not limited thereto.

According to an embodiment of the present specification, the auxiliary electrode may be disposed in a non-emissive area of the organic light emitting device.

According to an embodiment of the present specification, the organic light emitting device may further include an insulation layer provided in the non-emissive area.

According to an embodiment of the present specification, the insulation layer may insulate the compensation resistance part and the auxiliary electrode from the organic material layer.

According to an embodiment of the present specification, the organic light emitting device may be sealed by the encapsulation layer.

The encapsulation layer may be formed of a transparent resin layer. The encapsulation layer may protect the organic light emitting device from oxygen and pollutants and may be formed of a transparent material so as not to obstruct emission of light from the organic light emitting device. The transparency may denote that light is transmitted by 60% or more. In detail, the transparency may denote that light is transmitted by 75% or more.

According to an embodiment of the present specification, the organic light emitting device may include a light scattering layer. In detail, according to an embodiment of the present specification, the organic light emitting device may further include a substrate provided on a surface opposite to a surface on which the organic material layer of the first electrode is provided, and may further include the light scattering layer provided between the substrate and the first electrode. According to an embodiment of the present specification, the light scattering layer may include a planarization layer. According to an embodiment of the present specification, the planarization layer may be provided between the first electrode and the light scattering layer.

Moreover, according to an embodiment of the present specification, the organic light emitting device may further include the substrate provided on the surface opposite to the surface on which the organic material layer of the first electrode is provided, and may further include the light scattering layer provided on a surface opposite to a surface on which the first electrode of the substrate is provided.

According to an embodiment of the present specification, a structure which induces scattering of light to enhance the light extraction efficiency of the organic light emitting device may be applied to the light scattering layer without being limited. In detail, according to an embodiment of the present specification, the light scattering layer may be a film which has a structure where scattering particles are dispersed in a binder, a concave-convex film, and/or hazeness.

According to an embodiment of the present specification, the light scattering layer may be directly formed on the substrate by a process such as spin coating, bar coating, or slit coating, or may be formed by a process of manufacturing a layer in a film type and attaching the layer.

According to an embodiment of the present specification, the organic light emitting device may be a flexible organic light emitting device. In this case, the substrate may include a flexible material. In detail, the substrate may be a thin film type glass which is bendable, a plastic substrate, or a film type substrate.

A material of the plastic substrate is not limited, but generally, the plastic substrate may include a film, such as polyethylene terephthalate (PET), polyethylene naphthalate (PEN), polyether ether ketone (PEEK), and polyimide (PI), in a single-layer type or a multi-layer type.

The present specification provides a display device including the organic light emitting device. In the display device, the organic light emitting device may act as a pixel or a backlight. In addition, details known to those skilled in the art may be applied to a configuration of the display device.

The present specification provides a display device including the organic light emitting device. In the display device, the organic light emitting device may act as an emission part. In addition, details known to those skilled in the art may be applied to elements necessary for the lighting device.

Hereinafter, in order to describe in detail the present specification, an embodiment will be described in detail. The present specification may, however, be embodied in many different forms and should not be construed as being limited to the embodiments set forth herein. Embodiments of the present specification are provided so that this disclosure will be thorough and complete, and will fully convey the concept of the present specification to those of ordinary skill in the art.

The below-described embodiment is a simulation material where a position-based voltage drop value based on a size of the first electrode and a shape of the border electrode is calculated, and a resistance value of the compensation resistance part suitable for each pixel part is calculated. In a case of manufacturing an organic light emitting device based on the below-described simulation material, an organic light emitting device showing the above-described uniform luminance may be manufactured.

Comparative Example 11

In a case of manufacturing an organic light emitting device under the below-described condition, a position-based voltage drop level of the first electrode has been calculated.

In an organic light emitting device where a current density between the first electrode which is a transparent electrode and a second electrode which is a metal electrode maintains 1 mA/cm$^2$, on the assumption that a surface resistance of the second electrode is 0Ω/□, an emissive area of the first electrode having a square shape is formed in a size of 100 mm×100 mm, and a border electrode is provided in each of four sides of the organic light emitting device. Also, a resistance of a metal border electrode is assumed as 0Ω, and in a case where a surface resistance of the first electrode based on an auxiliary electrode is 1Ω/□, a position-based voltage drop level of the first electrode has been calculated.

Figure 11:
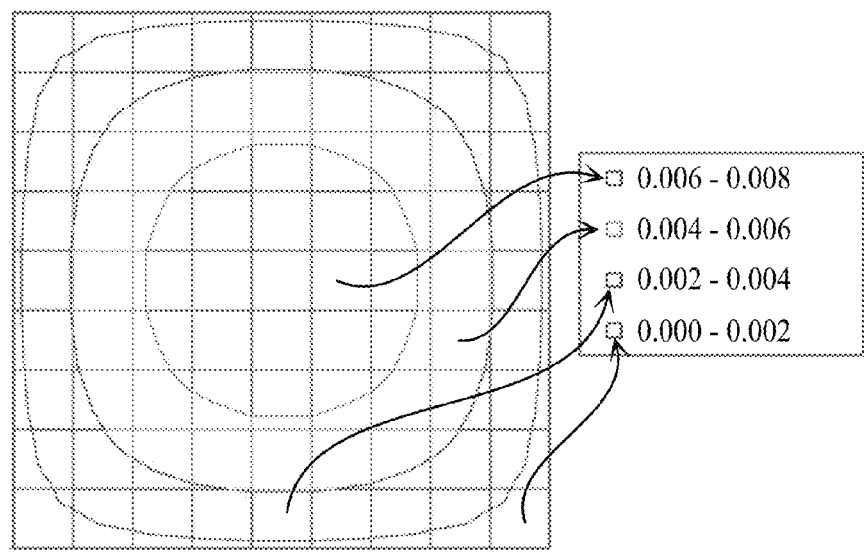
FIG. 11 shows a position-based voltage drop level of a first electrode in an organic light emitting device according to a comparative example 1.

FIG. 11 shows a position-based voltage drop level of a first electrode in an organic light emitting device according to the comparative example 1. In FIG. 11, a numerical value is Ω.

In the organic light emitting device according to the comparative example 1, an area where voltage drop occurs as much as possible in the first electrode is a center portion of the first electrode, and in this case, a voltage drop value "$V_{IRdrop\_max}$" is 7.3 mV.

Embodiment 11

In order to solve luminance non-uniformity caused by the voltage drop of a first electrode in an organic light emitting device according to the comparative example 1, the organic light emitting device has been manufactured by providing a compensation resistance part between an auxiliary electrode and a pixel part of the first electrode under the same condition as that of the comparative example 1.

In detail, the first electrode is formed in a size which is the same as the comparative example 1, and the organic light emitting device has been manufactured so that the number of pixel parts of the first electrode is 10,000, namely, a size of one pixel part is about 1 mm×1 mm. A border electrode is provided in each of four sides of the organic light emitting device, and a surface resistance of the first electrode based on the auxiliary electrode is 1 Ω/□.

Figure 12:
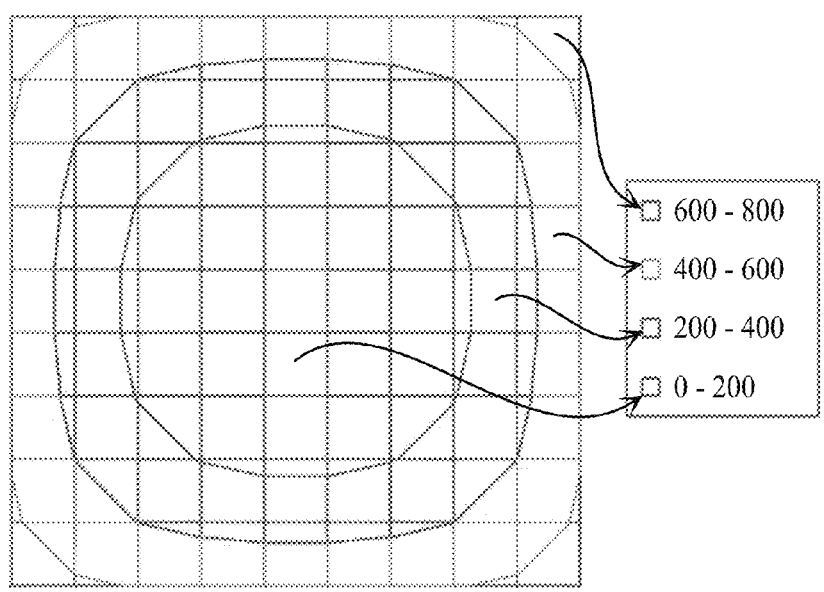
FIG. 12 shows a desired resistance value of a position-based compensation resistance part based on each of pixel parts in an organic light emitting device according to an embodiment 1.

FIG. 12 shows a desired resistance value of a position-based compensation resistance part based on each of pixel parts in an organic light emitting device according to the embodiment 1. In FIG. 12, a numerical value is Ω. As seen in FIG. 12, a maximum desired resistance value of the compensation resistance part included in the organic light emitting device according to the embodiment 1 is 679Ω.

Comparative Example 2

A position-based voltage drop level of a first electrode when an organic light emitting device is manufactured under the following condition has been calculated.

In an organic light emitting device where a current density between the first electrode which is a transparent electrode and a second electrode which is a metal electrode maintains 1 mA/cm$^2$, on the assumption that a surface resistance of the second electrode is 0Ω/□, an emissive area of the first electrode having a square shape is formed in a size of 100 mm×100 mm, and a border electrode is provided in each of four sides of the organic light emitting device. Also, a resistance of a metal border electrode is assumed as 0Ω, and in a case where a surface resistance of the first electrode based on an auxiliary electrode is 10Ω/□, a position-based voltage drop level of the first electrode has been calculated.

Figure 13:
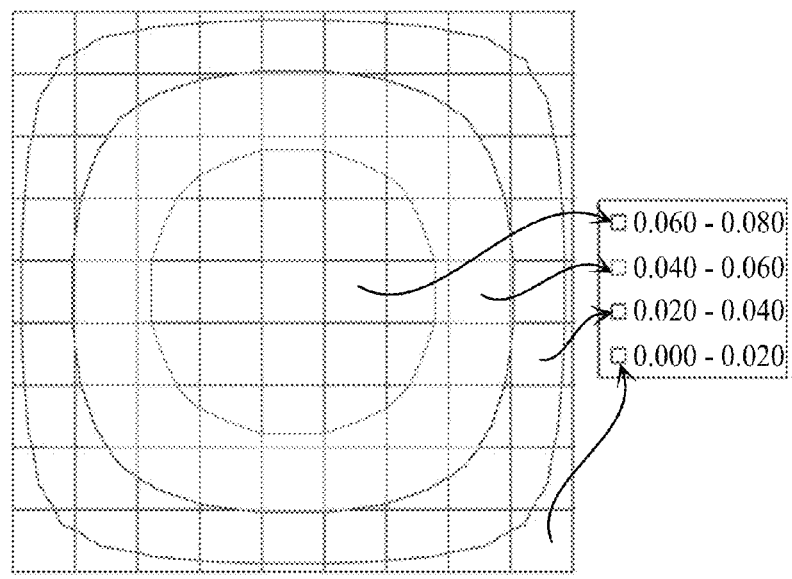
FIG. 13 shows voltage drop levels by positions of a first electrode in an organic light emitting device according to a comparative example 2.

FIG. 13 shows voltage drop levels by positions of a first electrode in an organic light emitting device according to the comparative example 2. In FIG. 13, a numerical value is Ω.

In the organic light emitting device according to the comparative example 2, an area where voltage drop occurs as much as possible in the first electrode is a center portion of the first electrode, and in this case, a voltage drop value "$V_{IRdrop\_max}$" is 73 mV.

Embodiment 2

In order to solve luminance non-uniformity caused by the voltage drop of a first electrode in an organic light emitting device according to the comparative example 2, the organic light emitting device has been manufactured by providing a compensation resistance part between an auxiliary electrode and a pixel part of the first electrode under the same condition as that of the comparative example 2.

In detail, the first electrode is formed in a size which is the same as the comparative example 2, and the organic light emitting device has been manufactured so that the number of pixel parts of the first electrode is 10,000, namely, a size of one pixel part is about 1 mm×1 mm. A border electrode is provided in each of four sides of the organic light emitting device, and a surface resistance of the first electrode based on the auxiliary electrode is 10 Ω/□.

Figure 14:
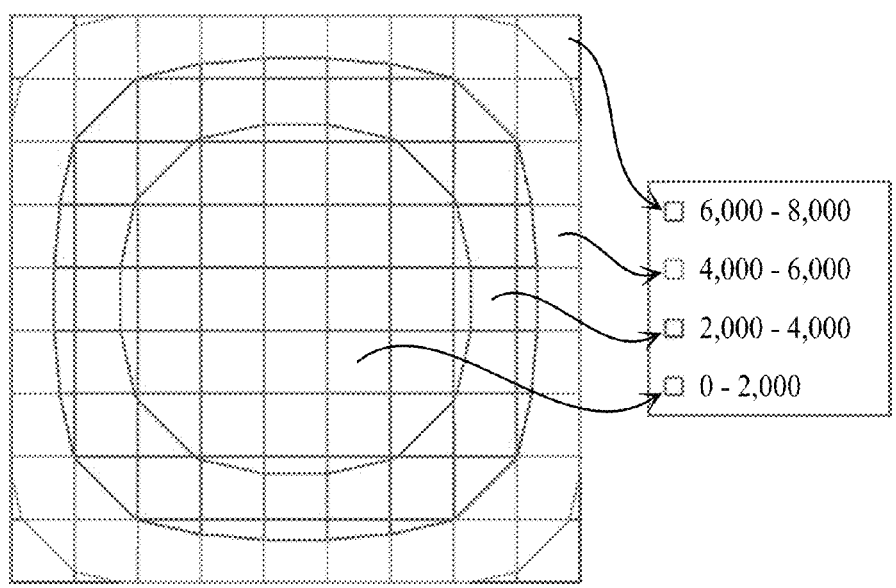
FIG. 14 shows a desired resistance value of a position-based compensation resistance part based on each of pixel parts in an organic light emitting device according to an embodiment 2.

FIG. 14 shows a desired resistance value of a position-based compensation resistance part based on each of pixel parts in an organic light emitting device according to the embodiment 2. In FIG. 14, a numerical value is Ω. As seen in FIG. 14, a maximum desired resistance value of the compensation resistance part included in the organic light emitting device according to the embodiment 2 is 6,785Ω.

Comparative Example 3

A position-based voltage drop level of a first electrode when an organic light emitting device is manufactured under the following condition has been calculated.

In an organic light emitting device where a current density between the first electrode which is a transparent electrode and a second electrode which is a metal electrode maintains 1 mA/cm$^2$, on the assumption that a surface resistance of the second electrode is 0Ω/□, an emissive area of the first electrode having a square shape is formed in a size of 100 mm×100 mm, and a border electrode is provided in one side of the organic light emitting device. Also, a resistance of a metal border electrode is assumed as 0Ω, and in a case where a surface resistance of the first electrode based on an auxiliary electrode is 1Ω/□, a position-based voltage drop level of the first electrode has been calculated.

Figure 15:
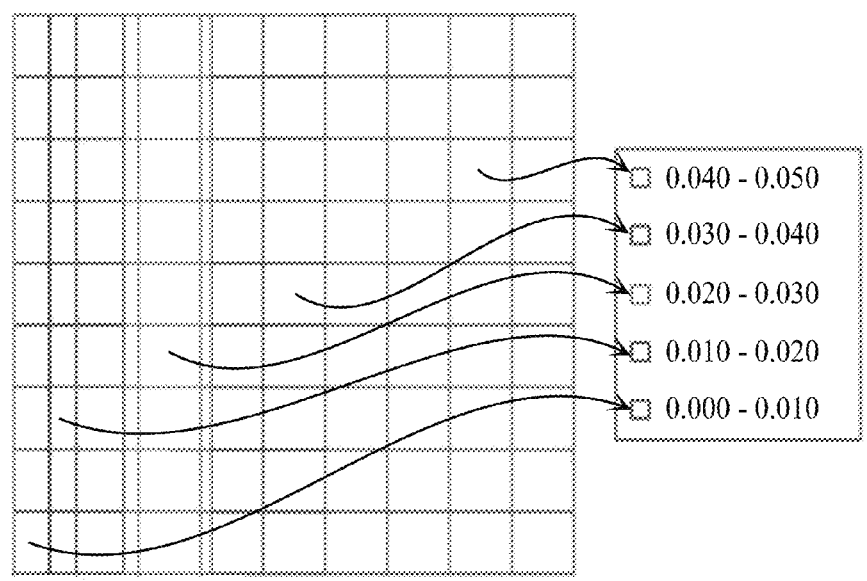
FIG. 15 shows voltage drop levels by positions of a first electrode in an organic light emitting device according to a comparative example 3.

FIG. 15 shows voltage drop levels by positions of a first electrode in an organic light emitting device according to the comparative example 3. In FIG. 15, a numerical value is Ω.

In the organic light emitting device according to the comparative example 3, an area where voltage drop occurs as much as possible in the first electrode is a center portion of the first electrode, and in this case, a voltage drop value "$V_{IRdrop\_max}$" is 50 mV.

Embodiment 3

In order to solve luminance non-uniformity caused by the voltage drop of a first electrode in an organic light emitting device according to the comparative example 3, the organic light emitting device has been manufactured by providing a compensation resistance part between an auxiliary electrode and a pixel part of the first electrode under the same condition as that of the comparative example 3.

In detail, the first electrode is formed in a size which is the same as the comparative example 3, and the organic light emitting device has been manufactured so that the number of pixel parts of the first electrode is 10,000, namely, a size of one pixel part is about 1 mm×1 mm. A border electrode is provided in one side of the organic light emitting device, and a surface resistance of the first electrode based on the auxiliary electrode is 1 Ω/□.

Figure 16:
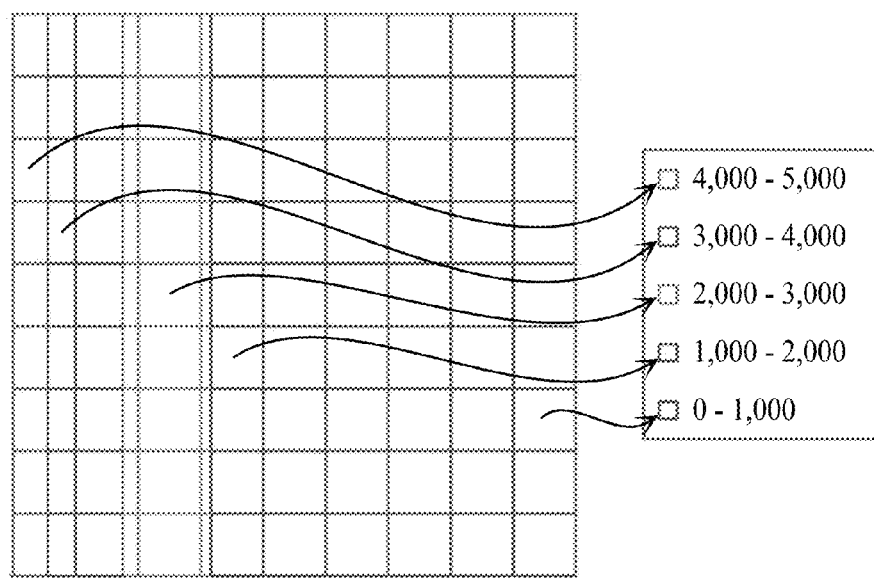
FIG. 16 shows a desired resistance value of a position-based compensation resistance part based on each of pixel parts in an organic light emitting device according to an embodiment 3.

FIG. 16 shows a desired resistance value of a position-based compensation resistance part based on each of pixel parts in an organic light emitting device according to the embodiment 3. In FIG. 16, a numerical value is Ω. As seen in FIG. 16, a maximum desired resistance value of the compensation resistance part included in the organic light emitting device according to the embodiment 3 is 4,500Ω.

Comparative Example 4

A position-based voltage drop level of a first electrode when an organic light emitting device is manufactured under the following condition has been calculated.

In an organic light emitting device where a current density between the first electrode which is a transparent electrode and a second electrode which is a metal electrode maintains 1 mA/cm$^2$, on the assumption that a surface resistance of the second electrode is 0Ω/□, an emissive area of the first electrode having a square shape is formed in a size of 100 mm×100 mm, and a border electrode is provided in each of two sides of the organic light emitting device. Also, a resistance of a metal border electrode is assumed as 0Ω, and in a case where a surface resistance of the first electrode based on an auxiliary electrode is 1Ω/□, a position-based voltage drop level of the first electrode has been calculated.

Figure 17:
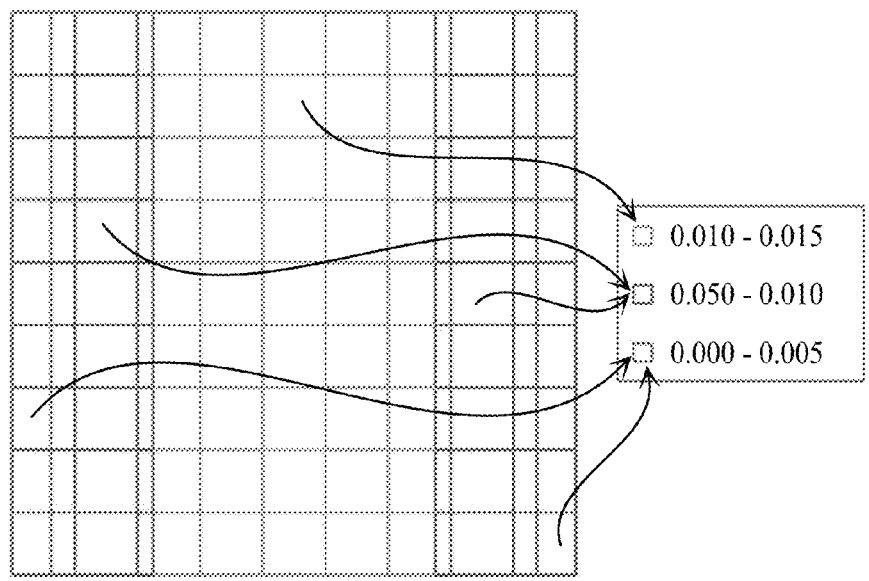
FIG. 17 shows voltage drop levels by positions of a first electrode in an organic light emitting device according to a comparative example 4.

FIG. 17 shows voltage drop levels by positions of a first electrode in an organic light emitting device according to the comparative example 4. In FIG. 17, a numerical value is Ω.

In the organic light emitting device according to the comparative example 4, an area where voltage drop occurs as much as possible in the first electrode is a center portion of the first electrode, and in this case, a voltage drop value "$V_{IRdrop\_max}$" is 13 mV.

Embodiment 4

In order to solve luminance non-uniformity caused by the voltage drop of a first electrode in an organic light emitting device according to the comparative example 4, the organic light emitting device has been manufactured by providing a compensation resistance part between an auxiliary electrode and a pixel part of the first electrode under the same condition as that of the comparative example 4.

In detail, the first electrode is formed in a size which is the same as the comparative example 4, and the organic light emitting device has been manufactured so that the number of pixel parts of the first electrode is 10,000, namely, a size of one pixel part is about 1 mm×1 mm. A border electrode is provided in each of two sides of the organic light emitting device, and a surface resistance of the first electrode based on the auxiliary electrode is 1 Ω/□.

Figure 18:
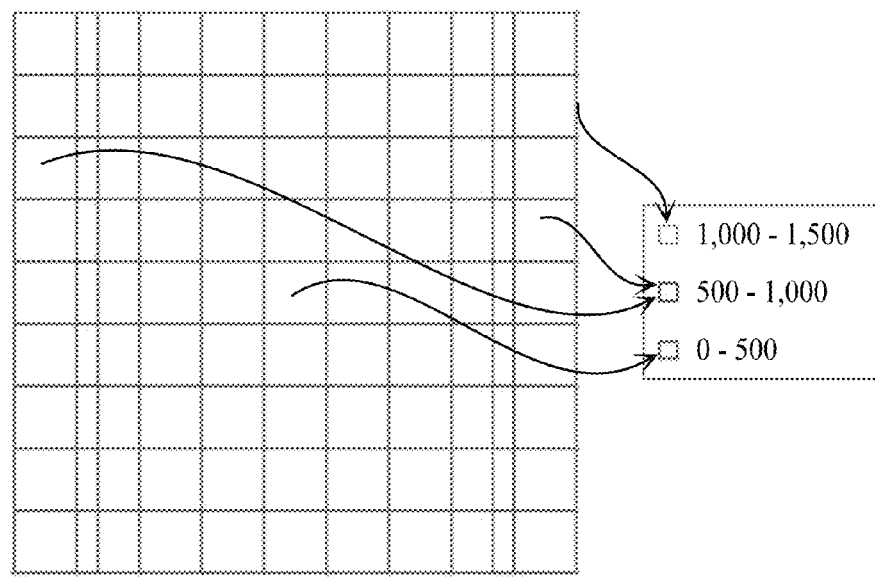
FIG. 18 shows a desired resistance value of a position-based compensation resistance part based on each of pixel parts in an organic light emitting device according to an embodiment 4.

FIG. 18 shows a desired resistance value of a position-based compensation resistance part based on each of pixel parts in an organic light emitting device according to the embodiment 4. In FIG. 18, a numerical value is Ω. As seen in FIG. 18, a maximum desired resistance value of the compensation resistance part included in the organic light emitting device according to the embodiment 4 is 1,000Ω.

Comparative Example 5

A position-based voltage drop level of a first electrode when an organic light emitting device is manufactured under the following condition has been calculated.

In an organic light emitting device where a current density between the first electrode which is a transparent electrode and a second electrode which is a metal electrode maintains 1 mA/cm$^2$, on the assumption that a surface resistance of the second electrode is 0Ω/□, an emissive area of the first electrode having a square shape is formed in a size of 300 mm×300 mm, and a border electrode is provided in each of four sides of the organic light emitting device. Also, a resistance of a metal border electrode is assumed as 0Ω, and in a case where a surface resistance of the first electrode based on an auxiliary electrode is 1Ω/□, a position-based voltage drop level of the first electrode has been calculated.

Figure 19:
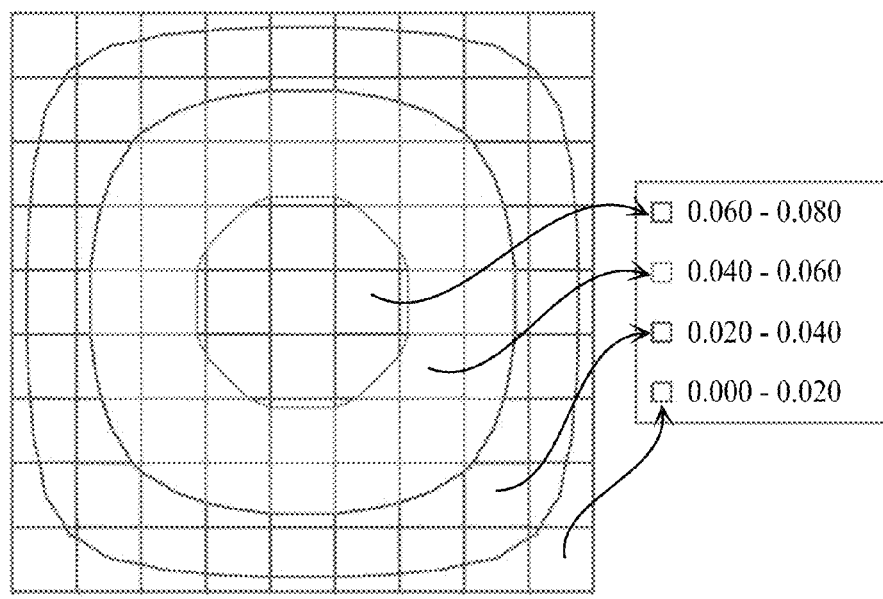
FIG. 19 shows voltage drop levels by positions of a first electrode in an organic light emitting device according to a comparative example 5.

FIG. 19 shows voltage drop levels by positions of a first electrode in an organic light emitting device according to the comparative example 5. In FIG. 19, a numerical value is Ω.

In the organic light emitting device according to the comparative example 5, an area where voltage drop occurs as much as possible in the first electrode is a center portion of the first electrode, and in this case, a voltage drop value "$V_{IRdrop\_max}$" is 66 mV.

Embodiment 51

In order to solve luminance non-uniformity caused by the voltage drop of a first electrode in an organic light emitting device according to the comparative example 5, the organic light emitting device has been manufactured by providing a compensation resistance part between an auxiliary electrode and a pixel part of the first electrode under the same condition as that of the comparative example 5.

In detail, the first electrode is formed in a size which is the same as the comparative example 5, and the organic light emitting device has been manufactured so that the number of pixel parts of the first electrode is 10,000, namely, a size of one pixel part is about 3 mm×3 mm. A border electrode is provided in each of four sides of the organic light emitting device, and a surface resistance of the first electrode based on the auxiliary electrode is 1 Ω/□.

Figure 20:
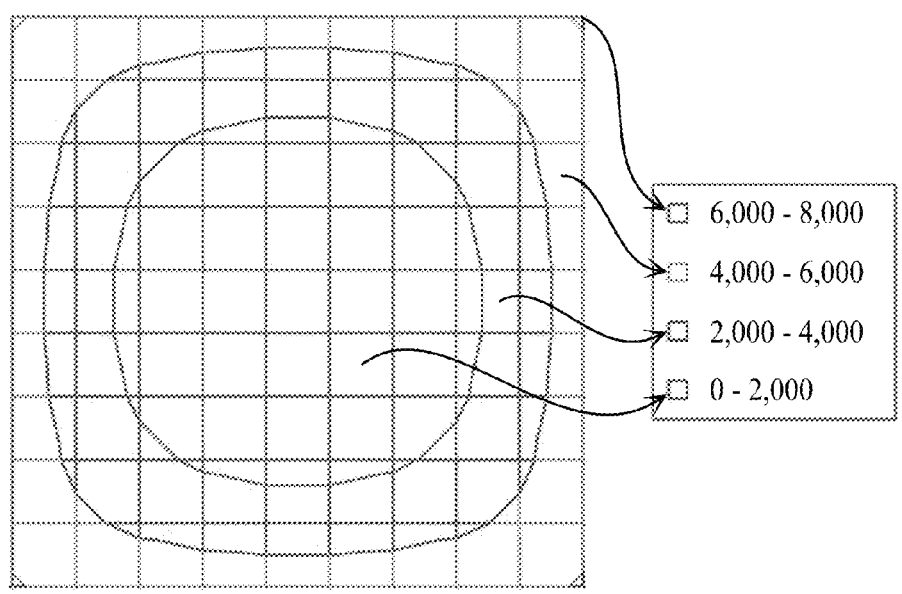
FIG. 20 shows a desired resistance value of a position-based compensation resistance part based on each of pixel parts in an organic light emitting device according to an embodiment 5.

FIG. 20 shows a desired resistance value of a position-based compensation resistance part based on each of pixel parts in an organic light emitting device according to the embodiment 5. In FIG. 20, a numerical value is Ω. As seen in FIG. 20, a maximum desired resistance value of the compensation resistance part included in the organic light emitting device according to the embodiment 5 is 6,107Ω.

The invention claimed is:

1. An organic light emitting device comprising:
a first electrode including two or more pixel parts spaced apart from each other;
a second electrode provided opposite to the first electrode;
an organic material layer including one or more emission layers provided between the first electrode and the second electrode; and
an auxiliary electrode electrically connected to each of the pixel parts,
wherein
at least one the pixel part comprises a compensation resistance part electrically connected to the auxiliary electrode, and
the compensation resistance part has a resistance value which is adjusted so that a voltage applied to a pixel part connected to the compensation resistance part is 0.8 times to 1.2 times a voltage applied to a pixel part where voltage drop occurs as much as possible.

2. The organic light emitting device of claim 1, wherein a difference between a maximum value of a resistance from one the pixel part to the auxiliary electrode and a minimum value of a resistance from the other one pixel part to the auxiliary electrode satisfies Equation 1 below:

$$\frac{1}{64} \times R_{surf} \times N_{cell} \le R_{diff} \le \frac{a}{b} \times R_{surf} \times N_{cell} \quad \text{[Equation 1]}$$

In the Equation 1,
$R_{diff}$ denotes a difference between a maximum value of a resistance from one the pixel part to the auxiliary electrode and a minimum value of a resistance from the other one pixel part to the auxiliary electrode,
$R_{surf}$ denotes a surface resistance of a first electrode,
$N_{cell}$ denotes number of pixel parts,
a denotes a length of a longest side of the organic light emitting device, and
b denotes a length of a shortest side of the organic light emitting device.

3. The organic light emitting device of claim 1, wherein a difference between a maximum value of a resistance from one the pixel part to the auxiliary electrode and a minimum value of a resistance from the other one pixel part to the auxiliary electrode satisfies Equation 1-1 below:

$$\frac{1}{16} \times R_{surf} \times N_{cell} \le R_{diff} \le \frac{1}{2} \times \frac{a}{b} \times R_{surf} \times N_{cell} \quad \text{[Equation 1-1]}$$

In the Equation 1-1,
$R_{diff}$ denotes a difference between a maximum value of a resistance from one the pixel part to the auxiliary electrode and a minimum value of a resistance from the other one pixel part to the auxiliary electrode,
$R_{surf}$ denotes a surface resistance of a first electrode,
$N_{cell}$ denotes number of pixel parts,
a denotes a length of a longest side of the organic light emitting device, and
b denotes a length of a shortest side of the organic light emitting device.

4. The organic light emitting device of claim 1, wherein a resistance of the compensation resistance part satisfies Equation 2 below:

$$0.5 \times \left( \frac{V_{IRdrop_{max}}}{A_{cell_{max}}} - \frac{V_{IRdrop_{cell}}}{A_{cell}} \right) + z \le$$
$$R_{comp_{cell}} \le 2 \times \left( \frac{V_{IRdrop_{max}}}{A_{cell_{max}}} - \frac{V_{IRdrop_{cell}}}{A_{cell}} \right) + z \quad \text{[Equation 2]}$$

In the Equation 2,
$R_{comp\_cell}$ denotes the resistance of the compensation resistance part,
$V_{IRdrop\_max}$ denotes a voltage in a pixel part where voltage drop occurs as much as possible,
$A_{cell\_max}$ denotes a current in the pixel part where voltage drop occurs as much as possible,
$V_{IRdrop\_cell}$ denotes a voltage in a pixel part including the compensation resistance part,
$A_{cell}$ denotes a current in the pixel part including the compensation resistance part, and
Z is 0Ω to 300,000 Ω.

5. The organic light emitting device of claim 1, wherein the compensation resistance part comprises a material which is the same as or different from a material of a pixel part including the compensation resistance part.

6. The organic light emitting device of claim 1, wherein the compensation resistance part comprises an area where a length in a direction in which a current flows is longer than a width in a direction vertical thereto.

7. The organic light emitting device of claim 1, wherein each of the pixel parts comprises the compensation resistance part.

8. The organic light emitting device of claim 1, wherein the auxiliary electrode is electrically connected to each of the pixel parts through the compensation resistance part.

9. The organic light emitting device of claim 1, wherein the organic light emitting device comprises a border electrode electrically connecting an external power source to the auxiliary electrode, and
the border electrode is provided on at least one side surface or all side surfaces of an emissive area of the organic light emitting device.

10. The organic light emitting device of claim 1, wherein a difference between an operating voltage of one the pixel part and an operating voltage of the other one pixel part is equal to or less than 0.01 V.

11. The organic light emitting device of claim 1, wherein a luminance difference in a whole emissive area of the organic light emitting device is equal to or less than 10%.

12. The organic light emitting device of claim 1, wherein the pixel parts are electrically connected to each other in parallel.

13. The organic light emitting device of claim 1, wherein the first electrode is a transparent electrode.

14. The organic light emitting device of claim 1, wherein the first electrode is a metal electrode.

15. The organic light emitting device of claim 1, wherein the organic light emitting device further comprises a substrate, and the first electrode is provided on the substrate.

16. The organic light emitting device of claim 1, further comprising:
a substrate provided on a surface opposite to a surface on which the organic material layer of the first electrode is provided; and
a light scattering layer provided between the substrate and the first electrode.

17. The organic light emitting device of claim 16, wherein the light scattering layer comprises a planarization layer.

18. The organic light emitting device of claim 1, further comprising:
a substrate provided on a surface opposite to a surface on which the organic material layer of the first electrode is provided; and
a light scattering layer on a surface opposite to a surface on which the first electrode of the substrate is provided.

19. The organic light emitting device of claim 1, wherein the organic light emitting device is a flexible organic light emitting device.

20. A display device comprising the organic light emitting device of one of claim 1.

21. A lighting device comprising the organic light emitting device of one of claim 1.

* * * * *